(12) United States Patent
Noudo

(10) Patent No.: US 11,749,703 B2
(45) Date of Patent: Sep. 5, 2023

(54) SOLID-STATE IMAGE PICKUP ELEMENT, METHOD OF MANUFACTURING SOLID-STATE IMAGE PICKUP ELEMENT, AND ELECTRONIC APPARATUS

(71) Applicant: SONY GROUP CORPORATION, Tokyo (JP)

(72) Inventor: Shinichiro Noudo, Kumamoto (JP)

(73) Assignee: SONY GROUP CORPORATION, Tokyo (JP)

( * ) Notice: Subject to any disclaimer, the term of this patent is extended or adjusted under 35 U.S.C. 154(b) by 0 days.

(21) Appl. No.: 17/347,908

(22) Filed: Jun. 15, 2021

(65) Prior Publication Data

US 2021/0313382 A1    Oct. 7, 2021

Related U.S. Application Data

(63) Continuation of application No. 16/941,105, filed on Jul. 28, 2020, now Pat. No. 11,088,195, which is a
(Continued)

(30) Foreign Application Priority Data

Oct. 28, 2016    (JP) .................... 2016-211195

(51) Int. Cl.
*H01L 27/146* (2006.01)
*H01L 21/76* (2006.01)
(Continued)

(52) U.S. Cl.
CPC ........ *H01L 27/14645* (2013.01); *H01L 21/76* (2013.01); *H01L 27/146* (2013.01);
(Continued)

(58) Field of Classification Search
None
See application file for complete search history.

(56) References Cited

U.S. PATENT DOCUMENTS 9,288,380 B2 *  3/2016  Nomura ............ H04N 5/37457
10,249,666 B2 *  4/2019  Pyo .................. H01L 27/14627
(Continued)

FOREIGN PATENT DOCUMENTS

| CN | 102169883 A | 8/2011 |
|---|---|---|
| CN | 102376726 A | 3/2012 |

(Continued)

OTHER PUBLICATIONS

International Search Report for International (PCT) Patent Application No. PCT/JP2017/026643, dated Sep. 26, 2017, 2 pages.
(Continued)

*Primary Examiner* — Hsien Ming Lee
(74) *Attorney, Agent, or Firm* — SHERIDAN ROSS P.C.

(57) ABSTRACT

To solve at least one of various problems in an image sensor in a 2PD scheme. A solid-state image pickup element includes a plurality of pixels each including a photoelectric conversion element formed on a silicon substrate, in which some pixels in the plurality of pixels each have the photoelectric conversion element partitioned by a first-type separating region extending in a plate shape in a direction along a thickness direction of the silicon substrate, and other pixels in the plurality of pixels each have the photoelectric conversion element partitioned by a second-type separating region formed with a material different from a material of the first-type separating region, the second-type separating region extending in a plate shape in the direction along the thickness direction of the silicon substrate.

20 Claims, 11 Drawing Sheets

Related U.S. Application Data continuation of application No. 16/342,314, filed as application No. PCT/JP2017/026643 on Jul. 24, 2017, now Pat. No. 10,840,289.

(51) Int. Cl.
*H01L 31/10* (2006.01)
*H04N 25/70* (2023.01)

(52) U.S. Cl.
CPC .... *H01L 27/1463* (2013.01); *H01L 27/14605* (2013.01); *H01L 27/14683* (2013.01); *H01L 27/14689* (2013.01); *H01L 31/10* (2013.01); *H04N 25/70* (2023.01); *H01L 27/14621* (2013.01); *H01L 27/14623* (2013.01); *H01L 27/14627* (2013.01)

(56) References Cited

U.S. PATENT DOCUMENTS

| | | | |
|---|---|---|---|
| 10,840,289 | B2 | 11/2020 | Noudo |
| 11,088,195 | B2 | 8/2021 | Noudo |
| 2007/0290285 | A1 | 12/2007 | Shimada et al. |
| 2014/0346628 | A1 | 11/2014 | Okazaki |
| 2015/0002713 | A1 | 1/2015 | Nomura |
| 2016/0204144 | A1* | 7/2016 | Lee .................. H01L 27/1464 257/432 |
| 2016/0234449 | A1 | 8/2016 | Ishiwata |
| 2017/0047363 | A1* | 2/2017 | Choi .................. H01L 27/1464 |
| 2017/0098680 | A1 | 4/2017 | Roh et al. |

FOREIGN PATENT DOCUMENTS

| | | |
|---|---|---|
| CN | 102683365 A | 9/2012 |
| CN | 104576669 A | 4/2015 |
| JP | 2001-250931 | 9/2001 |
| JP | 2006190769 A | 7/2006 |
| JP | 2009-158800 | 7/2009 |
| JP | 2012-182332 | 9/2012 |
| JP | 2014-229810 | 12/2014 |
| JP | 2015-012127 | 1/2015 |
| JP | 2015023259 A | 2/2015 |
| JP | 2015-065269 | 4/2015 |
| JP | 2015162658 A | 9/2015 |
| JP | 2016-139988 | 8/2016 |

OTHER PUBLICATIONS

Official Action (no English translation available) for Japan Patent Application No. 2018-547127, dated Apr. 27, 2021, 2 pages.

Official Action for U.S. Appl. No. 16/342,314, dated Apr. 29, 2020, 12 pages.

Notice of Allowance for U.S. Appl. No. 16/342,314, dated Aug. 5, 2020, 8 pages.

Official Action for U.S. Appl. No. 16/941,105, dated Dec. 10, 2020, 21 pages.

Notice of Allowance for U.S. Appl. No. 16/941,105, dated Apr. 7, 2021, 8 pages.

Corrected Notice of Allowance for U.S. Appl. No. 16/941,105, dated Jun. 11, 2021, 4 pages.

* cited by examiner

SILICON DIOXIDE FILM
WIDTH: 120 nm

SILICON DIOXIDE FILM
WIDTH: 320 nm

SOLID-STATE IMAGE PICKUP ELEMENT, METHOD OF MANUFACTURING SOLID-STATE IMAGE PICKUP ELEMENT, AND ELECTRONIC APPARATUS

CROSS REFERENCE TO RELATED APPLICATIONS

This application is a continuation application of U.S. application Ser. No. 16/941,105 filed Jul. 28, 2020, which is a continuation application of U.S. application Ser. No. 16/342,314 filed Apr. 16, 2019, now U.S. Pat. No. 10,840,289, which is a national stage application under 35 U.S.C. 371 and claims the benefit of PCT Application No. PCT/JP2017/026643 having an international filing date of Jul. 24, 2017, which designated the United States, which PCT application claimed the benefit of Japanese Patent Application No. 2016-211195 filed Oct. 28, 2016, the entire disclosures of each of which are incorporated herein by reference.

TECHNICAL FIELD

The present technology relates to a solid-state image pickup element, a method of manufacturing the solid-state image pickup element, and an electronic apparatus.

BACKGROUND ART

There are roughly three types of auto focus (AF) scheme of a camera: phase-difference AF; contrast AF; and on-sensor phase-difference AF. The on-sensor phase-difference AF is the latest scheme and has been developed progressively in recent years. Because the on-sensor phase-difference AF has the function of a phase-difference AF sensor incorporated in pixels themselves of an image sensor, the on-sensor phase-difference AF can achieve the phase-difference AF without being separately equipped with separator lenses and a phase-difference AF sensor required in the phase-difference AF. In other words, similarly to the phase-difference AF, the on-sensor phase-difference AF instantaneously measures the amount of AF deviation, making it possible for a set lens to come into focus very quickly.

Patent Document 1 discloses a light-shielding metal scheme that is the mainstream of the pixel structure of the on-sensor phase-difference AF. In the light-shielding metal scheme, there are provided a plurality of pairs of pixels (pupil pixel), in which each pixel is substantially half covered with light-shielding metal so as to detect only light that passes through one side of the exit pupil of a set lens. The pupil pixel includes: a first pixel including a first side of a pixel substantially half covered with the light-shielding metal; and a second pixel including a second side of a pixel substantially half covered with the light-shielding metal.

The first pixel and the second pixel are provided at mutually close positions in an image sensor. Thus, when the set lens is in focus, a first received image acquired from the first pixel and a second received image acquired from the second pixel are identical. Meanwhile, when the set lens is out of focus, a shift occurs between the first received image and the second received image, and the images switch between focusing on the near side and focusing on the far side. In such a case, the deviation in focusing of the set lens together with a deviation direction can be measured instantaneously.

Because the on-sensor phase-difference pixels in the light-shielding metal scheme are defective pixels from which an output signal cannot be used for image forming, there is a disadvantage that image quality of the image sensor is lower than that of an image sensor having the same number of pixels with no on-sensor phase-difference AF.

As a solution for the disadvantage, for example, Patent Document 2 has proposed a scheme in which, with two divided pixels formed by dividing a photodiode corresponding to an on-chip lens (hereinafter, referred to as an OCL), ranging is performed using a first received image acquired from one divided pixel (first divided pixel) and a second received image acquired from the other divided pixel (second divided pixel), and cumulation of the outputs of the two divided pixels generates an output for one pixel that can be used for image forming (hereinafter, referred to as a 2PD scheme). Needless to say, for example, Patent Document 3 has proposed a concept in which pixels specializing in phase difference as the 2PD scheme and ordinary pixels used for image generation as a 1PD scheme are mounted mixedly.

CITATION LIST

Patent Document

Patent Document 1: Japanese Patent Application Laid-Open No. 2012-182332
Patent Document 2: Japanese Patent Application Laid-Open No. 2001-250931
Patent Document 3: Japanese Patent Application Laid-Open No. 2015-65269

SUMMARY OF THE INVENTION

Problems to be Solved by the Invention

As described above, because the 2PD scheme allows a dense layout of the on-sensor phase-difference pixels in addition to no defective pixel, there is an advantage that accurate acquisition of positional deviations in the center of gravity of the output of the first divided pixel and the output of the second divided pixel, allows improvement in AF precision.

Meanwhile, because a photodiode is divided into two, the volume of the photodiode as a whole is reduced by a separating portion for pixel division, resulting in occurrence of a disadvantage that the relative sensitivity is lower than that of a non-divided pixel (hereinafter, referred to as a 1PD scheme) equivalent in OCL size. Note that, as a method of separating a phase-difference pixel, metal embedding, oxide-film embedding, and implantation have been known.

However, according to a prototype of an image sensor in the 2PD scheme actually produced by the present inventors, besides a reduction in the volume of a photodiode, various problems has been found, such as color mixture between divided pixels and occurrence of loss in sensitivity in a separating portion.

The present technology has been made in consideration of the problems, and an object of the present technology is to solve at least one of various problems in an image sensor in the 2PD scheme.

Solutions to Problems

According to one aspect of the present technology, there is provided a solid-state image pickup element that includes a plurality of pixels each including a photoelectric conversion element formed on a silicon substrate, in which some pixels in the plurality of pixels each have the photoelectric conversion element partitioned by a first-type separating region extending in a plate shape in a direction along a thickness direction of the silicon substrate, and other pixels in the plurality of pixels each have the photoelectric conversion element partitioned by a second-type separating region formed with a material different from a material of the first-type separating region, the second-type separating region extending in a plate shape in the direction along the thickness direction of the silicon substrate.

According to another aspect of the present technology, there is provided a method of manufacturing a solid-state image pickup element that includes a plurality of pixels each including a photoelectric conversion element formed on a silicon substrate, the method including: a step of forming a first-type separating region extending in a plate shape in a direction along a thickness direction of the silicon substrate, the first-type separating region partitioning the photoelectric conversion element of each of some pixels in the plurality of pixels; and a step of forming a second-type separating region with a material different from a material of the first-type separating region, the second-type separating region extending in a plate shape in the direction along the thickness direction of the silicon substrate, the second-type separating region partitioning the photoelectric conversion element of each of other pixels in the plurality of pixels.

According to another aspect of the present technology, there is provided an electronic apparatus that includes a solid-state image pickup element including a plurality of pixels each including a photoelectric conversion element formed on a silicon substrate, in which some pixels in the plurality of pixels each have the photoelectric conversion element partitioned by a first-type separating region extending in a plate shape in a direction along a thickness direction of the silicon substrate, and other pixels in the plurality of pixels each have the photoelectric conversion element partitioned by a second-type separating region formed with a material different from a material of the first-type separating region, the second-type separating region extending in a plate shape in the direction along the thickness direction of the silicon substrate.

Note that the present technology further includes various aspects, such as an aspect in which the solid-state image pickup element described above is performed being incorporated in a different apparatus and an aspect in which the solid-state image pickup element described above is performed with a different method. The present technology further includes various aspects, such as an aspect in which the method of manufacturing a solid-state image pickup element described above is performed as part of a different method.

Effects of the Invention

According to the present technology, at least one of various problems in an image sensor in a 2PD scheme can be solved. Note that, because the effects described in the present specification are just exemplary, the present technology is not limited to these, and thus additional effects may be provided.

MODE FOR CARRYING OUT THE INVENTION

The present technology will be described below in accordance with the following order.
(A) First Embodiment:
(B) Second Embodiment:
(C) Third Embodiment:

(A) First Embodiment

Figure 1:
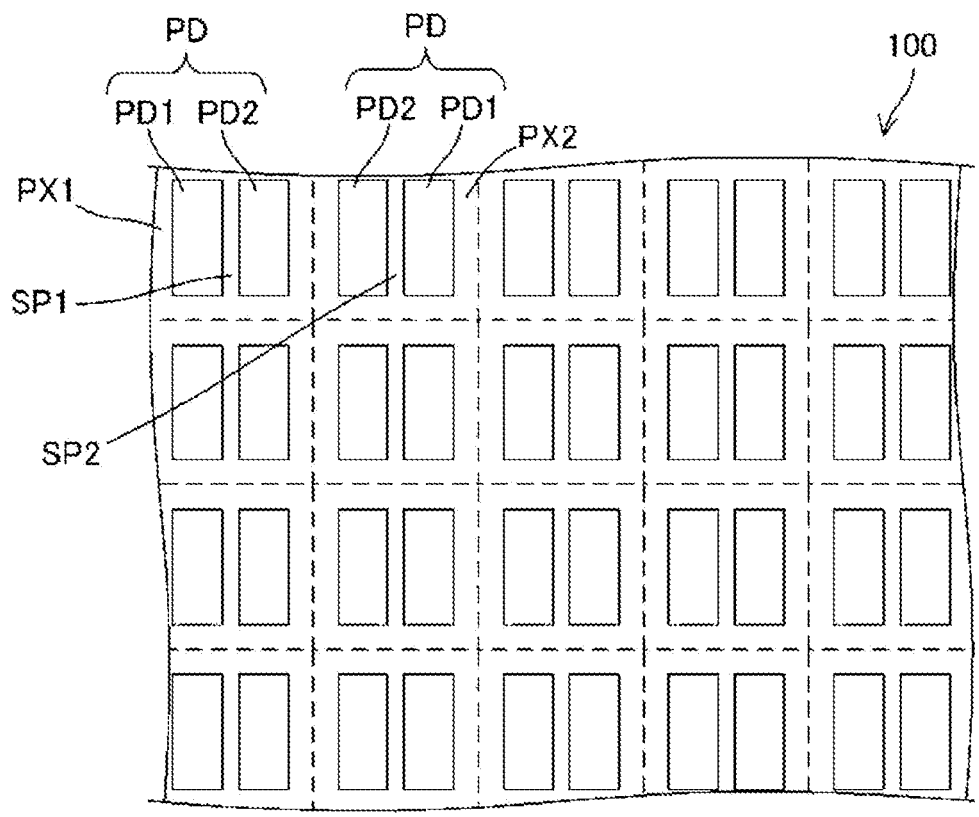
FIG. 1 is a plan view of the pixel arrangement of a solid-state image pickup element according to a first embodiment.
Figure 2:
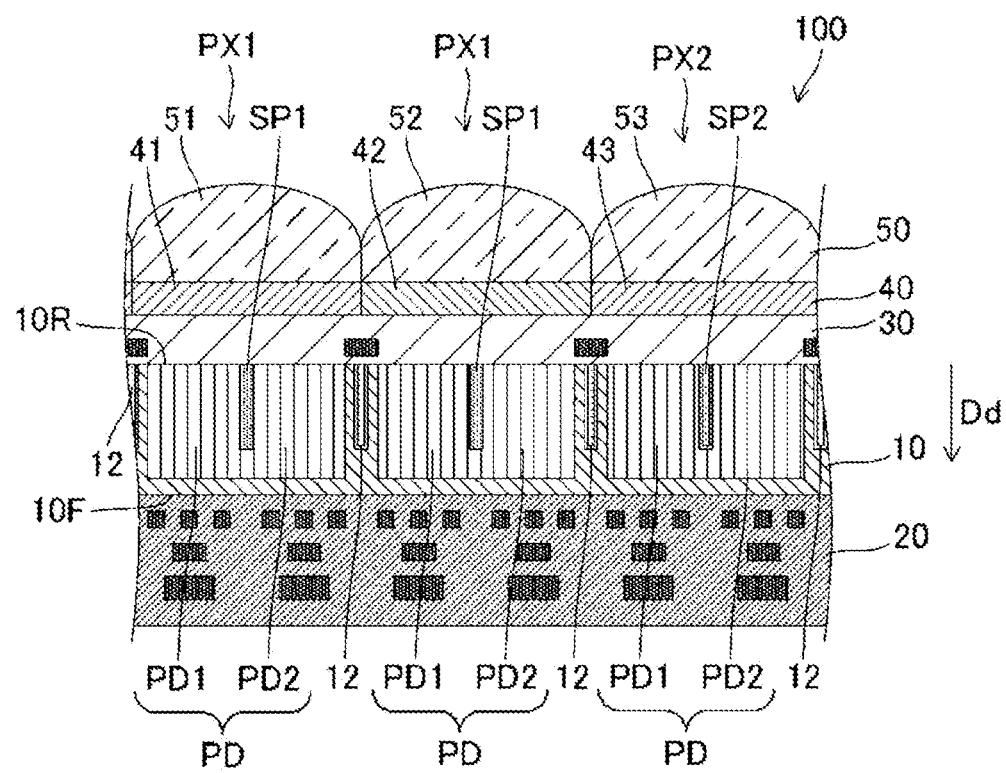
FIG. 2 is a schematic view of the sectional configuration of the solid-state image pickup element according to the first embodiment.

FIG. 1 is a plan view of the pixel arrangement of a solid-state image pickup element according to the present embodiment, and FIG. 2 is a schematic view of the sectional configuration of the solid-state image pickup element according to the present embodiment. Note that, although the present embodiment will be described with an exemplary back-illuminated solid-state image pickup element, the present technology can be also achieved as a front-illuminated solid-state image pickup element including a photoelectric conversion element PD to be described below.

The solid-state image pickup element 100 includes a plurality of pixels each including a photodiode as an embedded photoelectric conversion element PD formed on a silicon semiconductor substrate 10.

The semiconductor substrate 10 is provided with an element separator 12 along the boundary between the respective unit pixel regions of the plurality of pixels. The element separator 12 has a structure in which a silicon dioxide film is embedded in a trench formed by engraving the semiconductor substrate 10 or a structure in which a silicon dioxide film and metal are embedded in a trench formed by engraving the semiconductor substrate 10. This arrangement can inhibit color mixture between pixels more than an element separator formed by impurity ion implantation does.

Moreover, for some pixels in the plurality of pixels, the photoelectric conversion element PD formed in one of the unit pixel regions (regions respectively surrounded by the element separators 12) is further separated by a partition structure including a first-type separating region SP1 or a second-type separating region SP2.

Such pixels PX1 each have the photoelectric conversion element PD partitioned into a first portion PD1 and a second portion PD2 by the first-type separating region SP1 extending in a plate shape in a direction Dd along the thickness direction of the semiconductor substrate 10. Other pixels PX2 each have the photoelectric conversion element PD partitioned into the first portion PD1 and the second portion PD2 by the second-type separating region SP2 extending in a plate shape in the direction Dd along the thickness direction of the semiconductor substrate 10.

The number of separated portions of the photoelectric conversion element PD in one unit pixel region separated by the first-type separating region SP1 or the second-type separating region SP2 is required to be two or more. For example, there are an aspect in which a separating film is formed in the photoelectric conversion element PD in one unit pixel region to divide the photoelectric conversion element PD into two, and an aspect in which two separating films intersecting in a cross shape in plan view are formed in the photoelectric conversion element PD in one unit pixel region to divide the photoelectric conversion element PD into four. Dividing a photoelectric conversion element PD formed in one unit pixel region into two results in a so-called 2 photo diode (2PD) structure.

The first-type separating region SP1 and the second-type separating region SP2 each include a silicon dioxide film or an impurity ion implanted region. The present embodiment will be described below mainly with an exemplary case where the first-type separating region SP1 includes an impurity ion implanted region and the second-type separating region SP2 includes a silicon dioxide film.

In addition, in the example illustrated in FIG. 2, a wiring layer 20 is layered on the surface 10F side of the semiconductor substrate 10, and an insulating layer 30, a color filter layer 40 including a plurality of color filters 41 to 43, and an on-chip lens layer 50 including a plurality of on-chip lenses 51 to 53, are layered in this order on the back face 10R side of the semiconductor substrate 10.

The wiring layer 20 is a so-called multilayer wiring layer including a plurality of wiring layers disposed through an interlayer insulating film. Because no light is incident on the wiring layer side, a wiring layout can be designed flexibly.

The insulating layer 30 is formed with, for example, an antireflection coating. The antireflection coating is formed with a plurality of films having different refractive indices, and is formed with, for example, two films of a hafnium dioxide ($HfO_2$) film and a silicon dioxide film. A light-shielding film 31 is provided at the position along the boundary portion between the unit pixel regions and in the shape thereof, on the insulating layer 30. The light-shielding film 31 required to include a light-shielding material is preferably formed with a film of metal, such as aluminum (Al), tungsten (W), or copper (Cu), as a material having a strong light-shielding effect and capable of being precisely processed by micromachining, for example, etching.

A planarization film is formed on the insulating layer 30 including the light-shielding film 31. Then, in succession on the planarization film, the color filter layer 40 is formed and the on-chip lens layer 50 is formed on the color filter layer 40. For example, the on-chip lenses 51 to 53 are formed with an organic material, such as resin. For example, the planarization film can be formed with an organic material, such as resin. For example, the on-chip lenses 51 to 53 each have a light-condensing characteristic in which the beam waist of condensed light thereof is formed in the thickness range of the semiconductor substrate 10.

The color filters 41 to 43 included in the color filter layer 41 selectively transmit any color selected from a plurality of mutually different colors (e.g., red, green, and blue), and are, for example, color filters in the Bayer arrangement. The color of a color filter will be described below as the color of a pixel with a pixel having a red color filter as a red pixel, a pixel having a green color filter as a green pixel, and a pixel having a blue color filter as a blue pixel. Incident light on the solid-state image pickup element 100 is incident on the on-chip lens layer 50 side, and the respective beams of light that have been condensed by the on-chip lenses 51 to 53 and have been transmitted through the color filters 41 to 43 are received by the photoelectric conversion elements PD.

The color filters 41 to 43 and the on-chip lenses 51 to 53 are provided at respective positions corresponding to the unit pixel regions. Another layer may be provided between the semiconductor substrate 10 and the wiring layer 20, and another layer may be provided each between the semiconductor substrate 10, the insulating layer 30, the color filter layer 40, and the on-chip lens layer 50.

Figure 3:
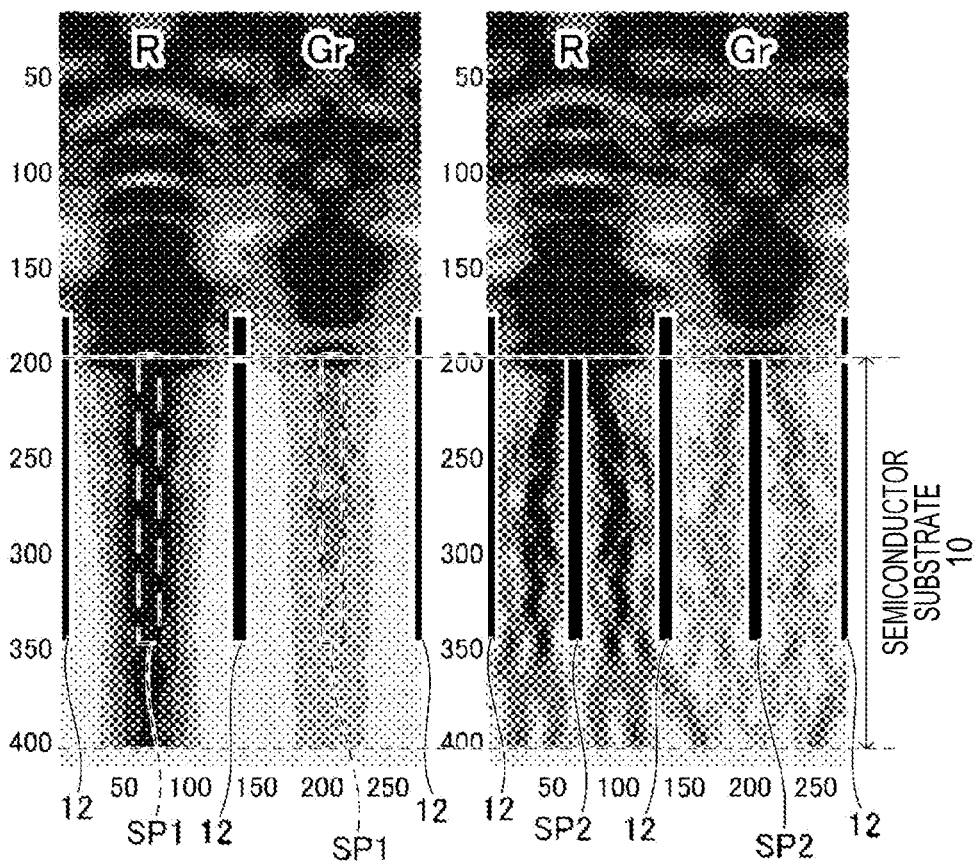
FIG. 3 illustrates results of an optical-path simulation of incident light for photoelectric conversion elements separated with different separating films.

FIG. 3 illustrates results of an optical-path simulation of incident light for photoelectric conversion elements PD separated with different separating films. FIG. 3(a) illustrates the separating films each formed with an impurity ion implanted region, and FIG. 3(b) illustrates the separating films each formed with a silicon dioxide film. The respective numerical values indicated on the vertical axis and the horizontal axis are in units of 10 nm.

The optical path for first-type separating regions SP1 formed by impurity ion implantation (FIG. 3(a)) is substantially similar to that in a case where no first-type separating region SP1 is provided. This is because there is no variation in refractive index between silicon that is the material of the semiconductor substrate 10 and a silicon dioxide film that is the material of each first-type separating region SP1. In other words, for each pixel separated by the first-type separating region SP1, the incident light incident on the back face 10R of the semiconductor substrate 10 after condensation by the on-chip lens is incident on a substantially center of the photoelectric conversion element PD of the pixel. Then, the incident light travels in a direction substantially perpendicular to a substrate face and reflects on the surface 10F of the semiconductor substrate 10, to travel in the opposite direction through substantially the same optical path.

Meanwhile, for each second-type separating region SP2 formed by the oxide film (FIG. 3(b)), with the optical path branching to both sides of the second-type separating region SP2, the light travels while repeatedly reflecting between the boundary of the element separator 12 and the boundary the second-type separating region SP2 as reflective faces. This is because there is a difference in refractive index between ambient silicon that is the material of the semiconductor substrate 10 and the second-type separating region SP2.

Here, because each second-type separating region SP2 is formed only to the middle of a depth of the semiconductor substrate 10 (a range of approximately 2 to 2.5 µm in the numerical value on the vertical axis in FIG. 3), there is a gap between the second-type separating region SP2 and the surface 10F of the semiconductor substrate 10 (a range of approximately 2.5 to 4 µm in the numerical value on the vertical axis of FIG. 3).

Thus, when the light travels exceeding the formed depth of the second-type separating region SP2, there is a possibility that the light that has traveled in the first portion PD1 of the photoelectric conversion element PD partitioned by the second-type separating region SP2, travels reflectively to the adjacent second portion PD2. Conversely, there is a possibility that the light that has traveled in the second portion PD2 of the photoelectric conversion element PD partitioned by the second-type separating region SP2, travels reflectively to the adjacent first portion PD1. In other words, there is a possibility that optical color mixture occurs on both sides of the second-type separating region SP2.

Figure 4:
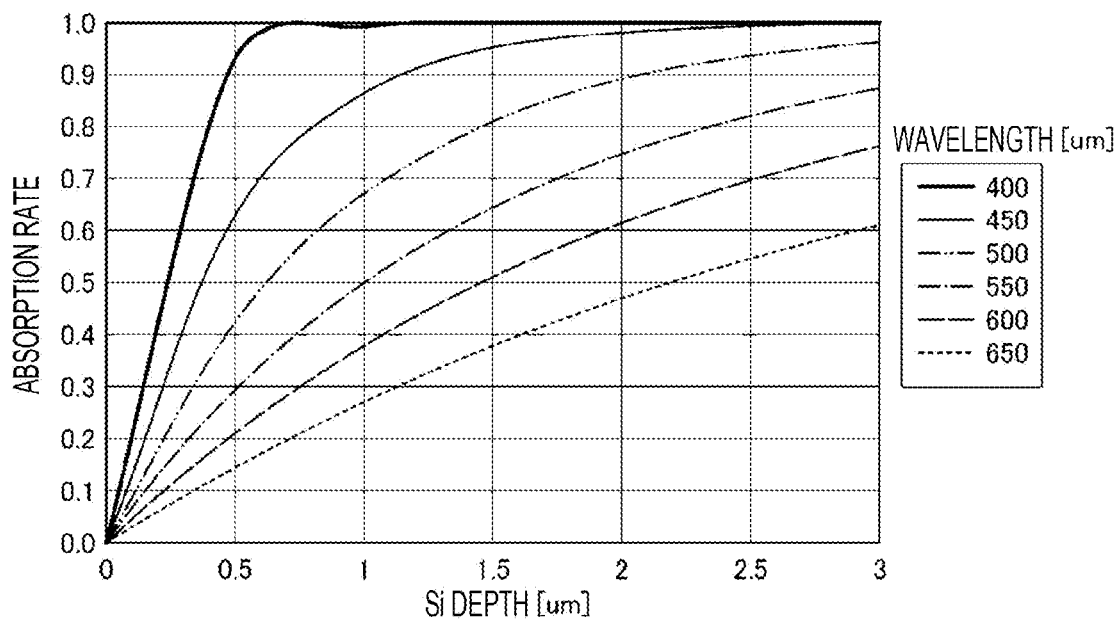
FIG. 4 is a graph illustrating the wavelength dependence of light absorptivity (photoelectric conversion rate) in silicon.

FIG. 4 is a graph illustrating the wavelength dependence of light absorptivity (photoelectric conversion rate) in silicon. As illustrated in the figure, silicon has a tendency that the light absorptivity increases with light shorter in wavelength and the light absorptivity decreases with light longer in wavelength. As a result, light is more likely to travel to the surface 10F side with respect to the formed depth of the second-type separating region SP2 in order of decreasing wavelength (red>green>blue), and optical color mixture is more likely to occur on both sides of the second-type separating region SP2 with light shorter in wavelength.

As a result, it can be understood that adjustment of the length in the depth direction of the second-type separating region SP2 enables adjustment of the degree of inhibition of color mixture of short-wavelength light. For example, a length of 0.5 µm or more in the depth direction of second-type separating region SP2, more preferably, a length of 1 µm thereof can inhibit light that is 400 nm or less in wavelength, from causing optical color mixture on both sides of the second-type separating region SP2.

Furthermore, because the element separator 12 is formed only to the middle of the depth of the semiconductor substrate 10 (a range of approximately 2 to 2.5 µm in the numerical value on the vertical axis of FIG. 3), a gap is formed between the second-type separating region SP2 and the surface 10F of the semiconductor substrate 10 (a range of approximately 2.5 to 4 µm in the numerical value on the vertical axis of FIG. 3).

Thus, when light travels exceeding the formed depth of the element separator 12, there is a possibility that the light that has traveled in one pixel partitioned by the element separator 12, travels reflectively to another pixel. In other words, there is a possibility that color mixture occurs between the adjacent pixels partitioned by the element separator 12.

Furthermore, light is more likely to travel to the surface 10F side with respect to the formed depth of the element separator 12 in order of decreasing wavelength (red>green>blue), and color mixture is more likely to occur between the adjacent pixels partitioned by the element separator 12 with light shorter in wavelength.

As a result, it can be understood that adjustment of the length in the depth direction of the element separator 12 enables adjustment of the degree of inhibition of color mixture of short-wavelength light. For example, a length of 0.5 µm or more in the depth direction of second-type separating region SP2, more preferably, a length of 1 µm thereof can inhibit light that is 400 nm or less in wavelength, from causing optical color mixture on both sides of the second-type separating region SP2. Further desirably, the element separator 12 is formed such that the length thereof reaches the surface 10F of the semiconductor substrate 10.

Although the element separator 12 having a length reaching the surface 10F of the semiconductor substrate 10 can be formed from the back face 10R side of the semiconductor substrate 10 as described above, the element separator 12 can be formed with a structure in which a silicon dioxide film is embedded in a trench formed from the surface 10F side of the semiconductor substrate 10 or with a structure in which a silicon dioxide film and metal are embedded in a trench formed from the surface 10F side of the semiconductor substrate 10.

With adoption of a technique of forming the element separator 12 from the surface 10F side, formation of the second-type separating region SP2 from the back face 10R side causes no concern that a previously formed trench groove causes irregularity of swept resist. Furthermore, the second-type separating region SP2 having a degree of length not reaching the surface 10F, formed from the back face 10R side enables escape of saturated and overflowing electrons from one side to the other side between the first portion PD1 and the second portion PD2 of the photoelectric conversion element PD partitioned by the second-type separating region SP2.

Figure 5:
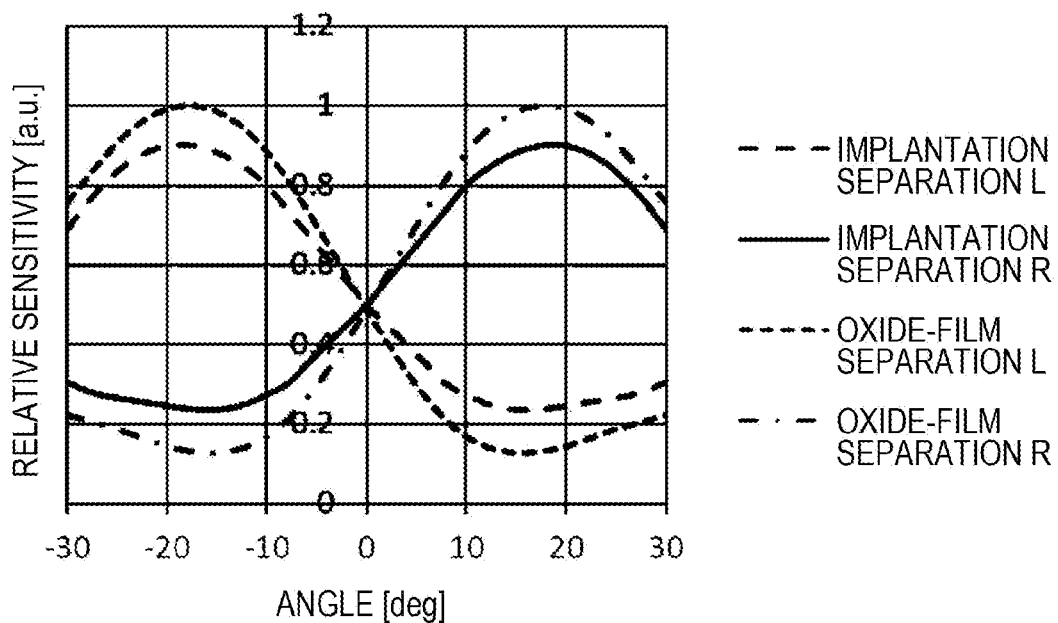
FIG. 5 is a graph illustrating comparison in light-receiving angle distribution characteristic between a first-type separating region formed by impurity ion implantation and a second-type separating region formed with an oxide film.

FIG. 5 is a graph illustrating comparison in light-receiving angle distribution characteristic between the first-type separating region SP1 formed by impurity ion implantation (implantation separation L and implantation separation R) and the second-type separating region SP2 formed with an oxide film (oxide-film separation L and oxide-film separation R).

From the figure, it can be understood that the second-type separating region SP2 is lower than the first-type separating region SP1 in terms of occurrence of color mixture at general light-receiving angles. This is because, in the case of using the first-type separating region SP1, whereas light propagates on the first-type separating region SP1 similarly to the silicon, electrons generated by photoelectric conversion on the first-type separating region SP1 at a potential higher than that of the silicon, moves to either the first portion PD1 or the second portion PD2 due to a probabilistic behavior, resulting in deterioration of the isolation of light-receiving angle distribution.

Figure 6:
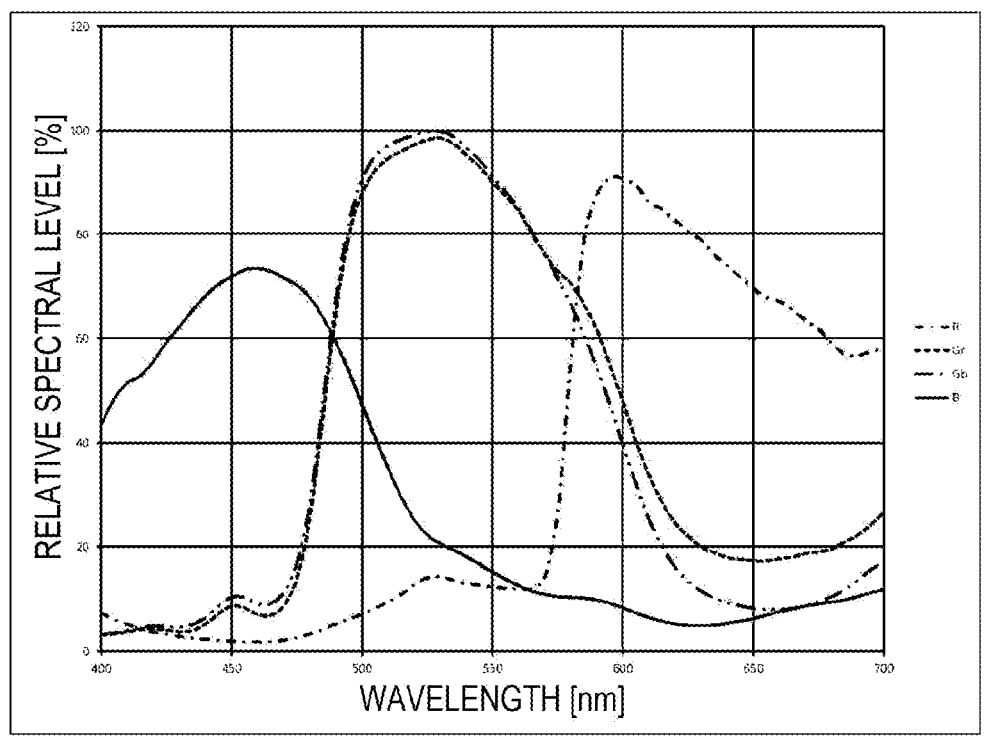
FIG. 6 is a plotted graph illustrating the added value of output signals of a first portion and a second portion of each photoelectric conversion element to which the first-type separating region is applied, with incident light varying in wavelength.
Figure 7:
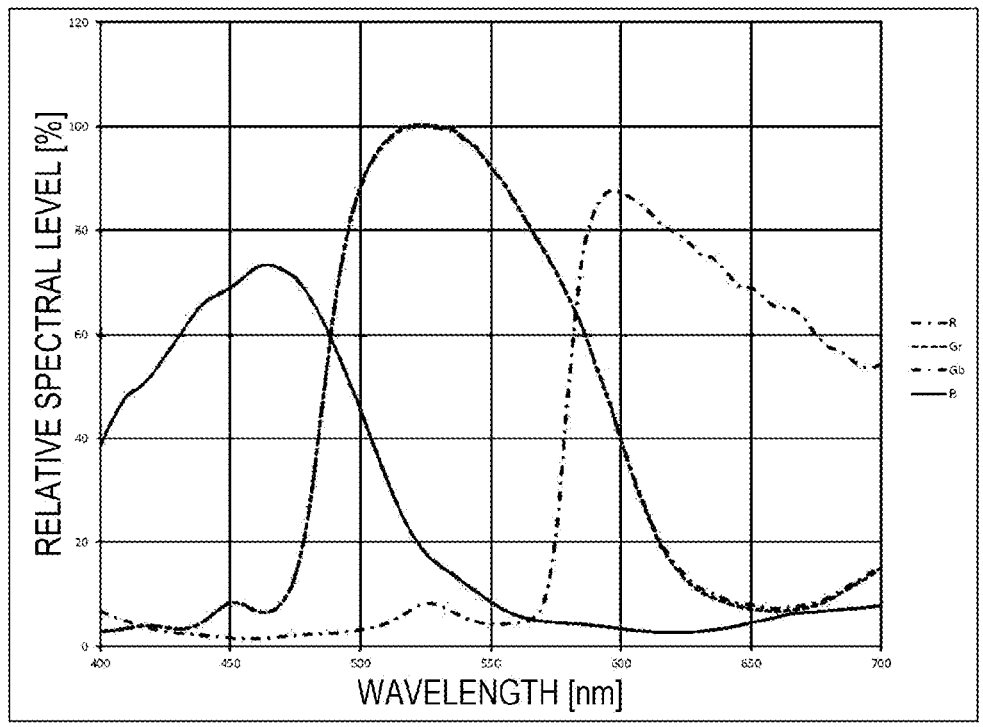
FIG. 7 is a plotted graph illustrating the added value of output signals of a first portion and a second portion of each photoelectric conversion element to which the second-type separating region is applied, with incident light varying in wavelength.

FIG. 6 is a plotted graph illustrating the added value of output signals of the first portion PD1 and the second portion PD2 of each photoelectric conversion element PD to which the first-type separating region SP1 is applied, with incident light varying in wavelength. FIG. 7 is a plotted graph illustrating the added value of output signals of the first portion PD1 and the second portion PD2 of each photoelectric conversion element PD to which the second-type separating region SP2 is applied, with incident light varying in wavelength. The relative spectral level indicated along the vertical axis in FIGS. 6 and 7 indicates, with a peak value in the output signal of a G pixel as the normalization factor (100%), the output signals of the other pixels to percentage.

As illustrated in FIG. 6, each photoelectric conversion element PD to which the first-type separating region SP1 is applied, indicates a light-receiving characteristic substantially equivalent to that of each photoelectric conversion element PD provided with no separating film.

As illustrated in FIG. 7, for the photoelectric conversion elements PD to which the second-type separating region SP2 is applied, optical color mixture occurs between the red pixel and the Gr pixel (green pixel adjacent to the red pixel) and optical color mixture occurs between the blue pixel and the Gb pixel (green pixel adjacent to the blue pixel), in comparison to photoelectric conversion elements PD provided with no separating film. However, it is observed that each photoelectric conversion element PD has a light-receiving characteristic substantially equivalent to that of each photoelectric conversion element PD provided with no separating film, at less than a wavelength of 480 nm, and each photoelectric conversion element PD has a light-receiving characteristic different from that of each photoelectric conversion element PD provided with no separating film, at a wavelength of 480 nm or more. Furthermore, a shift occurs between the Gr pixel and the Gb pixel at a wavelength of 600 nm or more.

Figure 8:
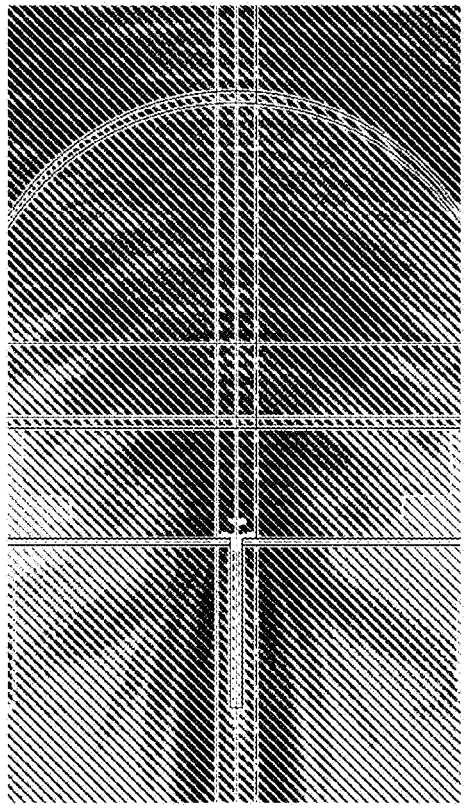
FIG. 8 is an illustration for describing the variation of an optical path due to the film width of the second-type separating region.
Figure 8:
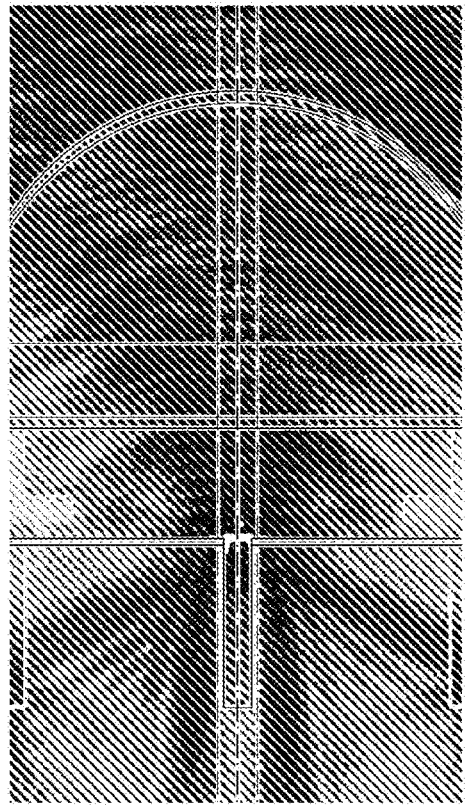

FIG. 8 is an illustration for describing the variation of an optical path due to the film width of the second-type separating region SP2. FIG. 8(a) illustrates an optical-path simulation in a case where the film width of the second-type separating region SP2 is 120 nm, and FIG. 8(b) illustrates an optical-path simulation in a case where the film width of the second-type separating region SP2 is 320 nm.

From the figures, it can be understood that light propagating inside the second-type separating region SP2 is longer in penetration depth and the amount of light propagating inside the second-type separating region SP2 is larger in the case where the film width of the second-type separating region SP2 is 320 nm, than in the case where the film width of the second-type separating region SP2 is 120 nm. In other words, it can be understood that, as the film width of the second-type separating region SP2 increases, the amount of light incident on the first portion PD1 and the second portion PD2 of the photoelectric conversion element PD decreases.

Figure 9:
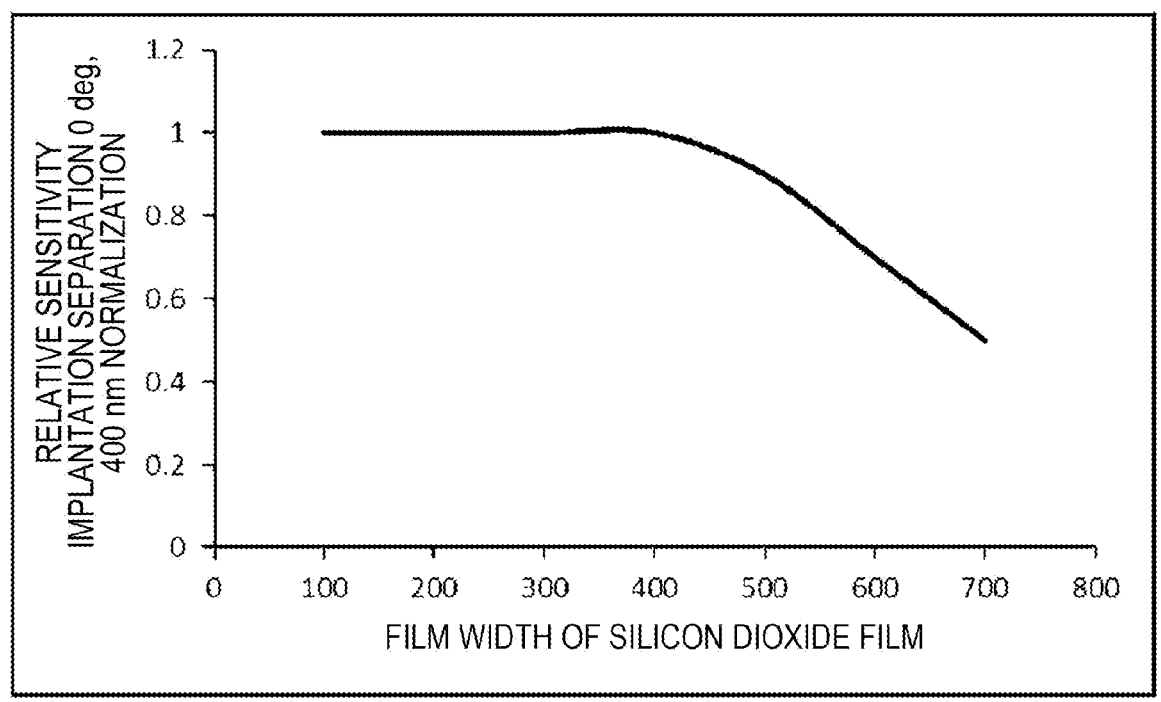
FIG. 9 is a graph illustrating a simulated result of the relationship between the film width of the second-type separating region and relative sensitivity.
Figure 10:
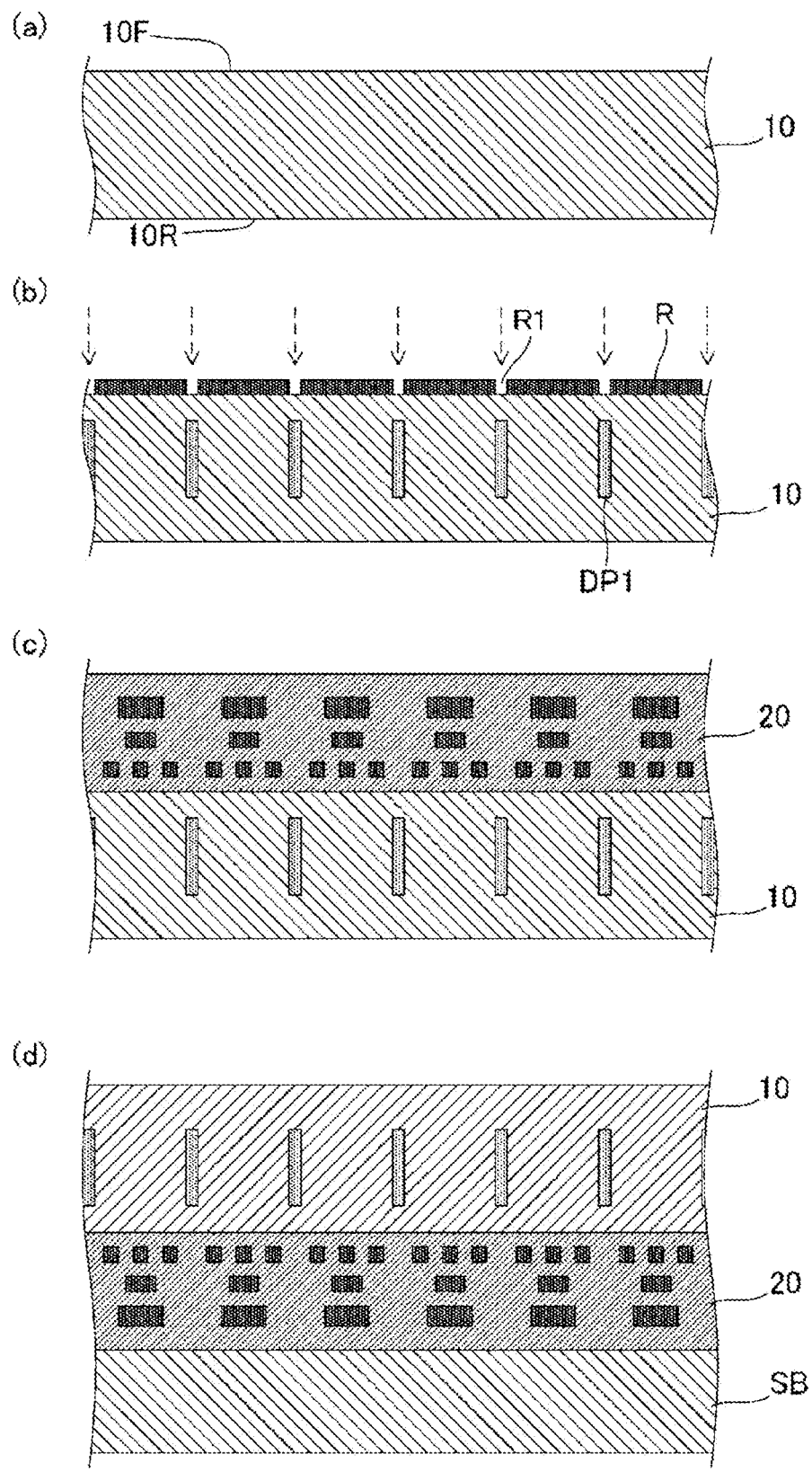
FIG. 10 is an illustration for describing an exemplary method of manufacturing the solid-state image pickup element.
Figure 11:
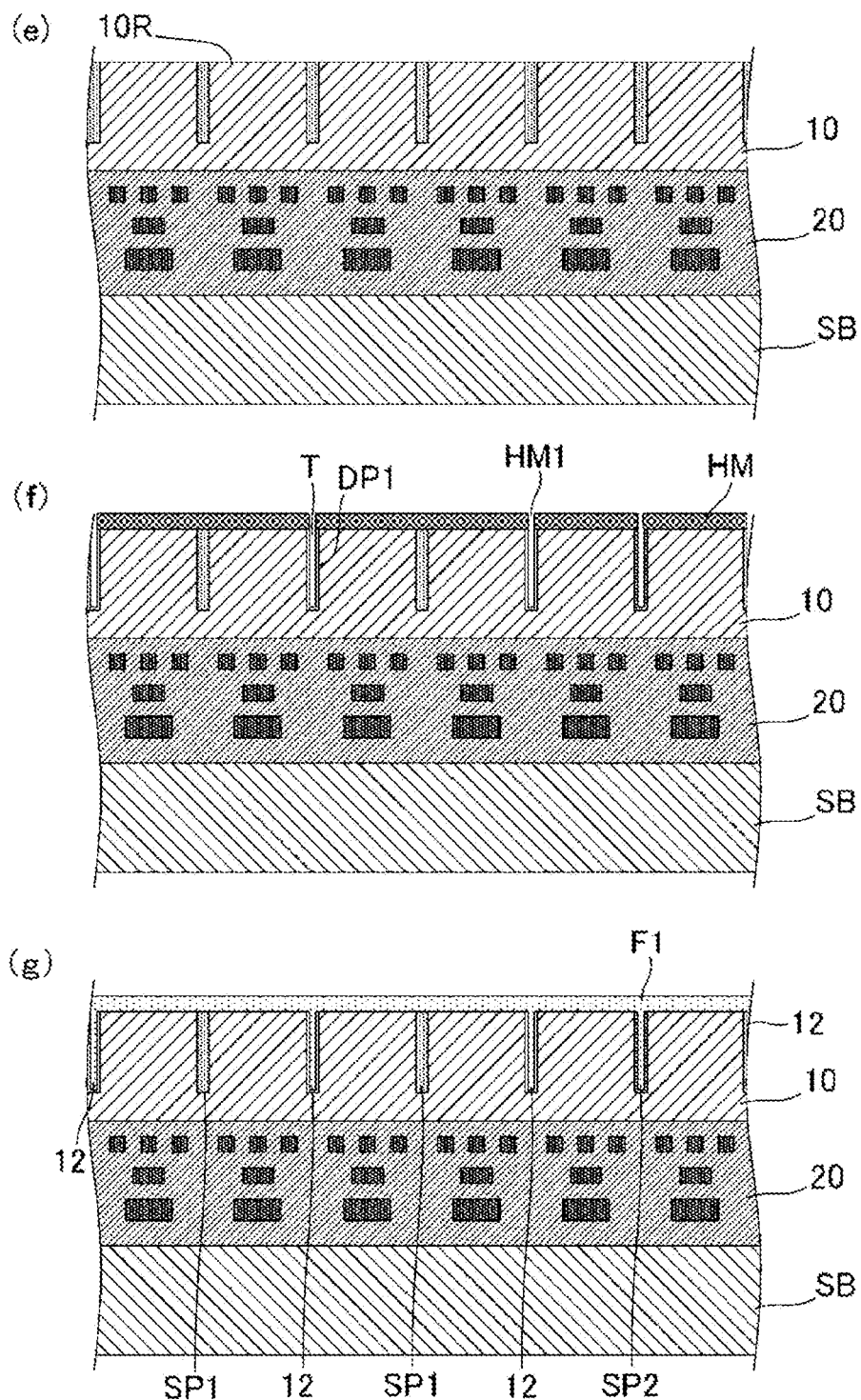
FIG. 11 is an illustration for describing an exemplary method of manufacturing the solid-state image pickup element.
Figure 12:
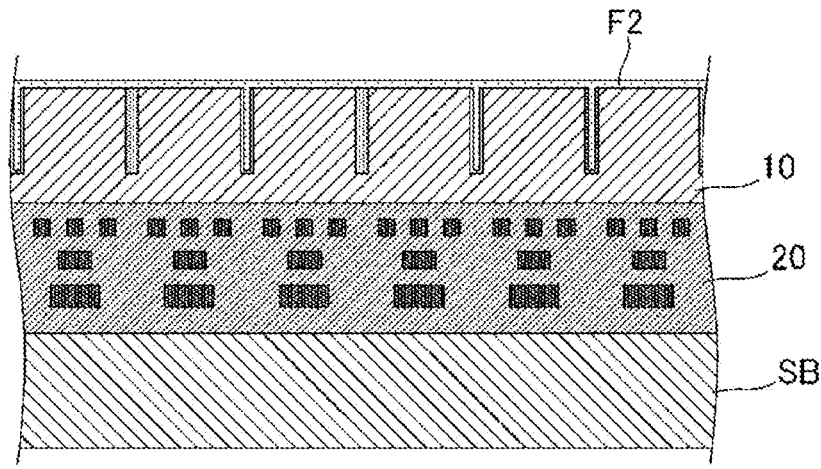
FIG. 12 is an illustration for describing an exemplary method of manufacturing the solid-state image pickup element.
Figure 12:
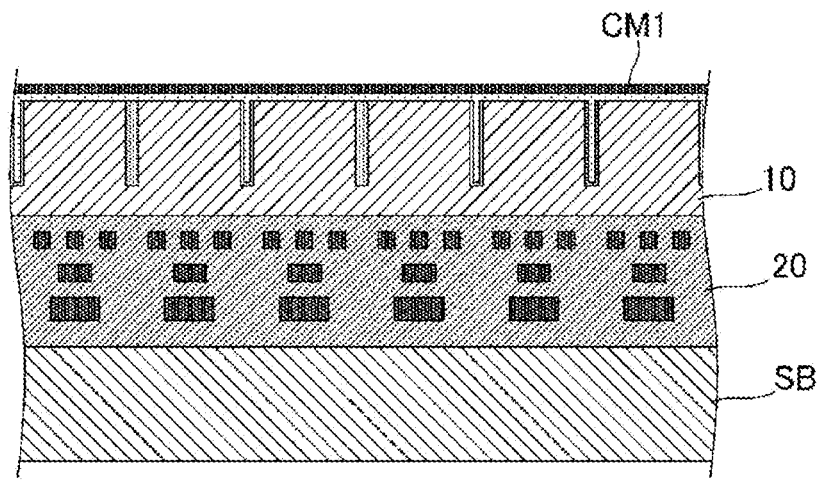
Figure 12:
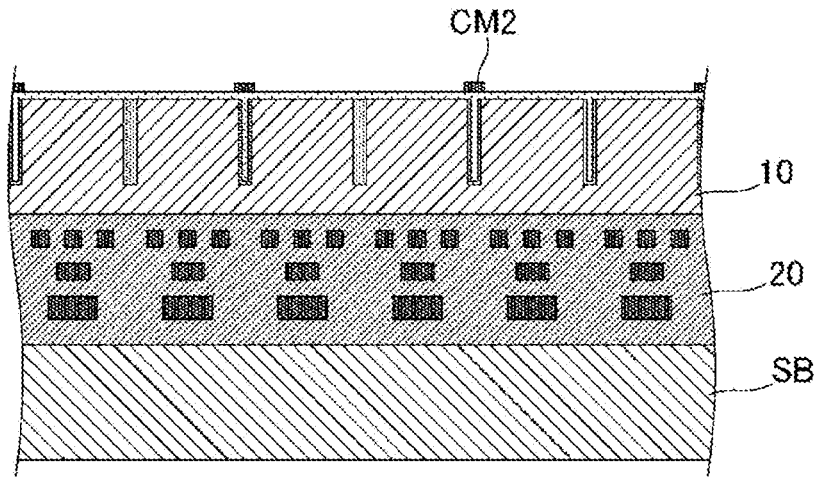
Figure 13:
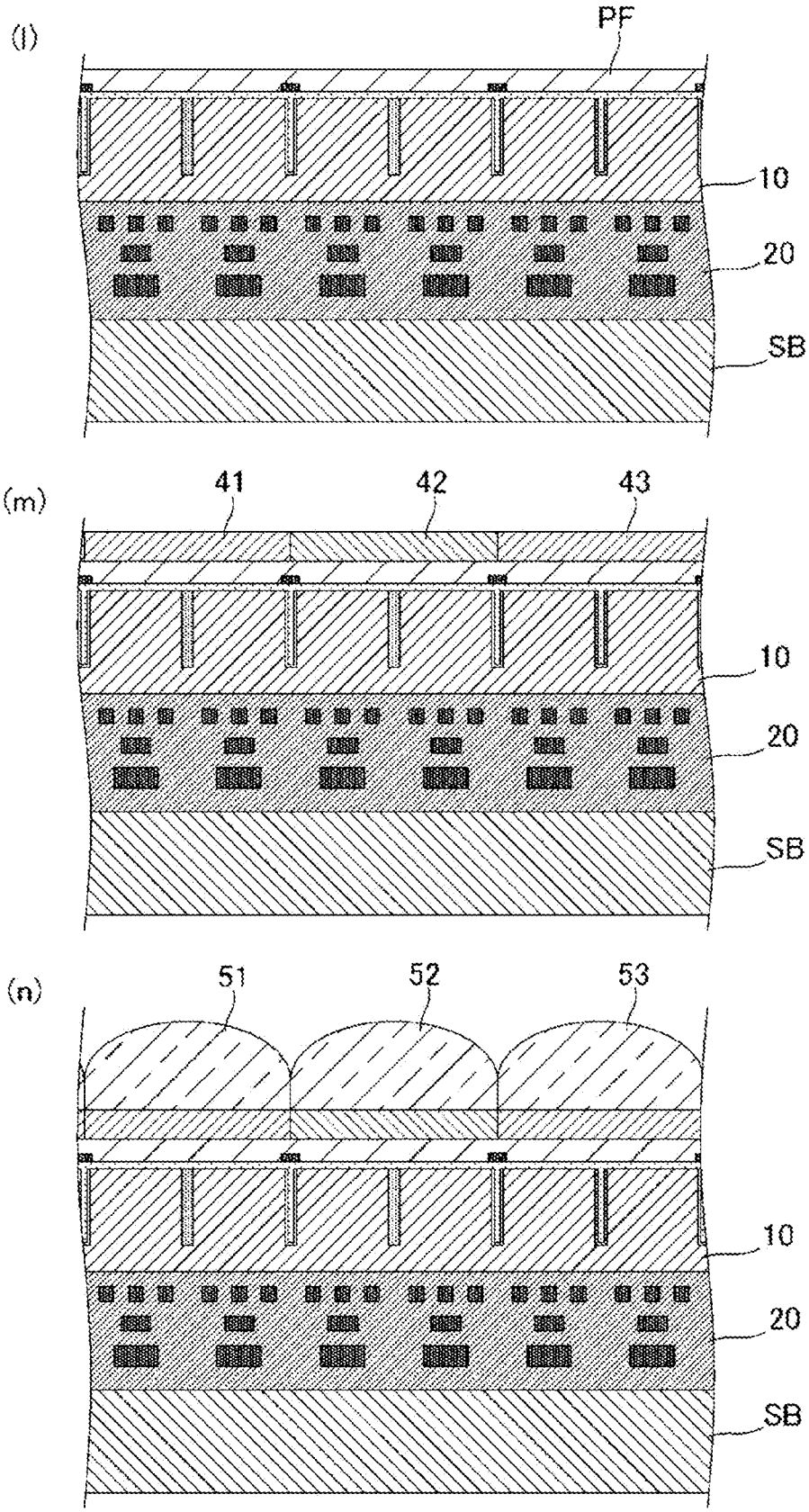
FIG. 13 is an illustration for describing an exemplary method of manufacturing the solid-state image pickup element.

FIG. 9 is a graph illustrating a simulated result of the relationship between the film width of the second-type separating region SP2 and relative sensitivity. The relative sensitivity indicated in the figure is normalized by the sensitivity in a case where light at 400 nm is perpendicularly (0 dgree) incident on a photoelectric conversion element PD to which the first-type separating region SP1 is applied. As illustrated in the figure, the relative sensitivity is substantially 1 at a film width of approximately 400 nm or less of second-type separating region SP2, and the relative sensitivity is approximately 0.8 or more at a film width of approximately 550 nm or less of second-type separating region SP2.

In other words, it can be understood that the second-type separating region SP2 having a film width equal to or less than the wavelength of visible light inhibits light propagation inside the second-type separating region SP2 as quickly as possible.

Furthermore, it can be understood that the second-type separating region SP2 having a film width equal to or less than the wavelength of blue light may achieve a relative sensitivity of 0.9 or more. Furthermore, it can be understood that the second-type separating region SP2 having a film width equal to or less than the wavelength of green light may achieve a relative sensitivity of 0.8 or more.

Figure 15:
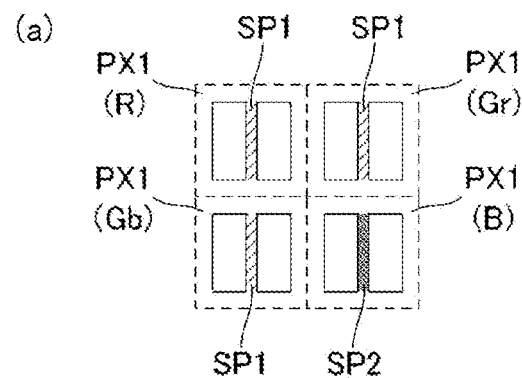
FIG. 15 is an illustration of exemplary combinations of a pixel to which the first-type separating region is applied and a pixel to which the second-type separating region is applied.
Figure 15:
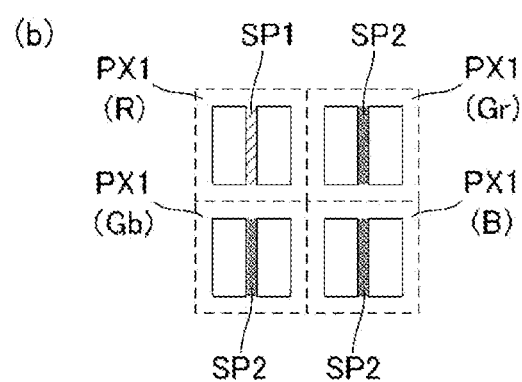
Figure 16:
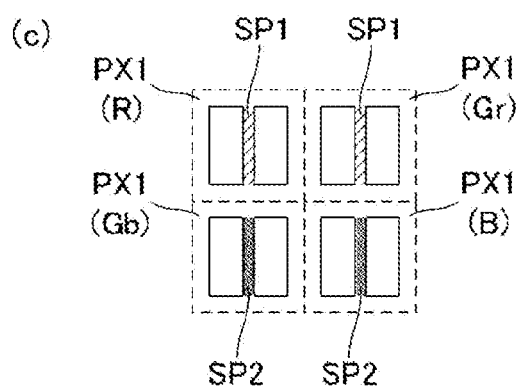
FIG. 16 is an illustration of exemplary combinations of a pixel to which the first-type separating region is applied and a pixel to which the second-type separating region is applied.
Figure 16:
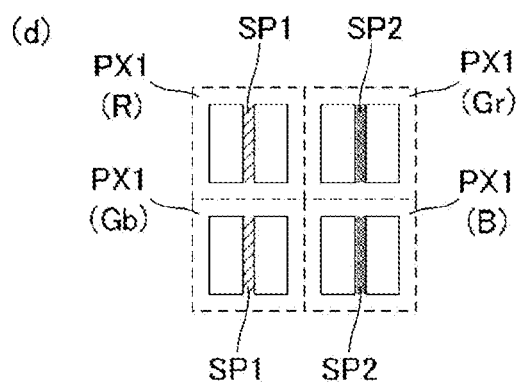

In consideration of the characteristics, it can be understood that the pixel PX1 to which the first-type separating region SP1 is applied and the pixel PX2 to which the second-type separating region SP2 is applied, can be selected with various combinations in accordance with uses. Exemplary specific combinations will be described below with reference to FIGS. 15 and 16, but variations on combinations are not limited to these.

Examples of a first specific combination are, as illustrated in FIG. 15(a), the photoelectric conversion elements PD of a red pixel and green pixels to which the first-type separating region SP1 is applied and the photoelectric conversion element PD of a blue pixel to which the second-type separating region SP2 is applied.

Thus, application of the second-type separating region SP2 to a photoelectric conversion element PD serving photoelectric conversion of blue light short in wavelength, enables achievement of favorable isolation of light-receiving angle distribution for blue light, and application of the first-type separating region SP1 to a photoelectric conversion element PD serving photoelectric conversion of green light or red light close to longer wavelength, can inhibit color mixture due to incidence of light reflected after arrival at the vicinity of the surface 10F, on an adjacent area partitioned by a separating film or an element separating region. At this time, the film width of the second-type separating region SP2 to be applied to the blue pixel is desirably the wavelength of blue light (approximately 400 nm) or less.

An example of a second specific combination is, as illustrated in FIG. 15(b), a case where the first-type separating region SP1 is applied to the photoelectric conversion element PD of a red pixel and the second-type separating region SP2 is applied to each of the photoelectric conversion elements PD of green pixels and a blue pixel.

Thus, application of the second-type separating region SP2 to the green pixels in addition to the blue pixel, enables favorable isolation of light-receiving angle distribution for the green pixels, and enables acquisition of an advantage that auto focus precision with on-sensor phase-difference improves in a case where a subject has the contrast of a green-wavelength region. Examples of a third specific combination are, as illustrated in FIG. 16(c), the photoelectric conversion elements PD of a Gb pixel and a blue pixel to which the second-type separating region SP2 is applied and the photoelectric conversion elements PD of a Gr pixel and a red pixel to which the first-type separating region SP1 is applied.

Thus, application of the second-type separating region SP2 to the blue pixel and the Gb pixel and application of the first-type separating region SP1 to the red pixel and the Gr pixel, enables, only for the blue pixel, color mixture due to incidence of light reflected after arrival at the vicinity of the surface 10F, on an adjacent area partitioned by a separating film or an element separating region, so that the combination is suitable for a case where red in color is regarded as important from the viewpoint of image forming and the like. At this time, alignment of the partitions of the second-type separating regions SP2 in a direction orthogonal to the direction in which the Gb pixel and the blue pixel are disposed in parallel, results in an advantage that the Gr pixel and the Gb pixel having different types of separating films, have no adverse effect on calculation for a shift amount in on-sensor phase-difference.

Examples of a fourth specific combination are, as illustrated in FIG. 16(d), the photoelectric conversion elements PD of a red pixel and a Gb pixel to which the first-type separating region SP1 is applied, and the photoelectric conversion elements PD of a blue pixel and a Gr pixel to which the second-type separating region SP2 is applied.

Thus, application of the second-type separating region SP2 to the blue pixel and the Gr pixel and application of the first-type separating region SP1 to the red pixel and the Gb pixel, enables, only for the red pixel, color mixture due to incidence of light reflected after arrival at the vicinity of the surface 10F, on an adjacent area partitioned by a separating film or an element separating region, so that the combination is suitable for a case where blue in color is regarded as important from the viewpoint of image forming and the like. Furthermore, the partitioning directions of the second-type separating regions SP2, orthogonal to the direction in which the Gr pixel and the red pixel are disposed in parallel, results in an advantage that the Gr pixel and the Gb pixel having different types of separating films, have no adverse effect on calculation for a shift amount in on-sensor phase-difference.

The configuration of, for example, a pixel transistor for outputting charge accumulated in each photoelectric conversion element PD in the solid-state image pickup element described above, can adopt a circuit configuration described in Japanese Patent Application Laid-Open No. 2015-65269, for example.

(B) Second Embodiment

Next, an exemplary method of manufacturing the solid-state image pickup element according to the first embodiment will be described with reference to FIGS. 10 to 13.

First, photodiodes as photoelectric conversion elements PD are formed by ion implantation in a two-dimensional arrangement having a two-dimensional matrix, from the surface 10F side of a semiconductor substrate 10. For example, a p-type semiconductor well region is formed in contact with an element separating region in which an element separator is to be formed, in a region corresponding to each photoelectric conversion element PD on the surface 10F of the semiconductor substrate 10, and a plurality of pixel transistors is formed in each p-type semiconductor well region. The pixel transistors each are formed with a source region, a drain region, a gate insulating film, and a gate electrode. Note that illustrations of the photoelectric conversion elements PD and the pixel transistors are omitted in FIGS. 10 to 13.

Next, a resist mask R is formed on the surface 10F of the semiconductor substrate 10, and impurity ion implantation is performed from above the resist mask R. The resist mask R has openings R1 in areas in which the element separator 12, first-type separating regions SP1, and second-type separating regions SP2 are to be formed. Impurity ion regions Dp1, each having a width corresponding to the opening R1, are formed in a predetermined depth range of the semiconductor substrate 10 by the impurity ion implantation.

Next, a wiring layer 20, including a plurality of wiring layers disposed through an interlayer insulating film, is layered on the surface 10F of the semiconductor substrate 10. An interlayer insulating film, such as a SiO$_2$ film, is layered on the wiring layer 20, and the interlayer insulating film is planarized by chemical mechanical polishing (CMP), so that the surface of the wiring layer 20 is formed to a substantially planarized face.

Next, a support substrate SB is stuck onto the substantially planarized face of the wiring layer 20, so that reinforcement is made. A semiconductor substrate, such as bulk silicon, is used for the support substrate SB, for example. Note that, in a case where part of a peripheral circuit or the entirety thereof is formed on a peripheral circuit substrate separately manufactured, the peripheral circuit substrate is stuck on the surface of the wiring layer 20, and the support substrate SB is stuck on the peripheral circuit substrate. Then, the semiconductor substrate 10, on which the support substrate SB is stuck, is turned upside down, so that the back face 10R of the semiconductor substrate 10 is set to an upper face.

Next, removal processing is performed by grinding and polishing from the back face 10R of the semiconductor substrate 10 to the vicinity of the back faces of the photoelectric conversion elements PD. Finally, the back face 10R of the semiconductor substrate 10 is processed by CMP so as to be substantially planarized. Note that the final-stage processing can be performed by etching.

Next, a silicon dioxide film HM is formed as a hard mask on the back face 10R of the semiconductor substrate 10, and openings HM1 are formed, by lithography and etching, at only portions at which the second-type separating regions SP2 are to be formed. The silicon dioxide film as the hard mask can be formed, for example, by high density plasma (HDP), plasma tetra ethyl oxysilane (P-TEOS), or the like.

Next, the back face 10R of the semiconductor substrate 10 is subjected to anisotropic dry etching through the hard mask, resulting in formation of trenches T included in the ranges of the impurity ion regions Dp1 at the portions at which the second-type separating regions SP2 are to be formed. In other words, the entire wall face of each trench T is covered with the impurity ion region Dp1 in shape. After the formation of the trenches T, the hard mask is removed, for example, by wet etching.

Next, a negatively fixed charged membrane is deposited on the back face 10R of the semiconductor substrate 10 and the entire wall face of each trench T. As the negatively fixed charged membrane, use of a material capable of generating fixed charge to reinforce pinning, due to accumulation onto a substrate such as silicon, is preferable, and a high-refractive-index material film or a high dielectric film having negative charge can be used. As a specific material, for example, an oxide or a nitride including at least one element of hafnium (Hf), aluminum (Al), zirconium (Zr), tantalum (Ta), or titanium (Ti), can be applied. Examples of deposition methods include a chemical vapor deposition method (hereinafter, referred to as a CVD), a sputtering method, an atomic layer deposition method (hereinafter, referred to as an ALD), and the like. Use of the ALD method enables simultaneous formation of a film thickness of approximately 1 nm of SiO$_2$ film that reduces an interface state during deposition. Furthermore, examples of materials other than the materials include an oxide and a nitride each including at least one element of lanthanum (La), praseodymium (Pr), cerium (Ce), neodymium (Nd), promethium (Pm), samarium (Sm), europium (Eu), gadolinium (Gd), terbium (Tb), dysprosium (Dy), holmium (Ho), thulium (Tm), ytterbium (Yb), lutetium (Lu), or yttrium (Y). Moreover, the fixed charged membrane can be formed with a hafnium oxynitride film or an aluminum oxynitride film. For each material for the fixed charged membrane described above, silicon (Si) or nitrogen (N) may be added into the film within the range in which the insulating property is not damaged. The concentration thereof is appropriately determined in the range in which the insulating property of the film is not damaged. Thus, addition of silicon (Si) or nitrogen (N) enables improvement of the thermal resistance and the capability of blocking ion implantation in a process, of the film.

Next, an oxide film is embedded into the trenches T, and an oxide film F1 layered on the back face 10R of the semiconductor substrate 10 is removed by etchback. At this time, the oxide film F1 deposited on the back face 10R of the semiconductor substrate 10, partially remains, resulting in a thin oxide film F2 covering the back face 10R. Thus, with the thin oxide film F2 remaining between a light-shielding film CM1 to be described later and the silicon of the semiconductor substrate 10, increase of the distance between the light-shielding film CM1 and the silicon of the semiconductor substrate 10, allows improvement in a darkness characteristic.

Next, a barrier metal film and a metal film are deposited as the light-shielding-film material layer CM1 on the oxide film F2 of the semiconductor substrate 10. The barrier metal film is formed with Ti, TiN, Ta, or TaN, for example, by a sputtering method or a CVD method. For example, the metal is formed with Cu, W, or Al by an electrolytic plating method. Then, a resist mask is formed selectively on the light-shielding-film material layer CM1. The resist mask is processed to remain on regions to be protected from light, such as a region for determination of black level, a peripheral-circuit region, and a region along the boundary of a pixel. The light-shielding-film material layer not covered with the resist mask is removed by lithography and etching, to form a light-shielding film CM2.

Next, a planarization film PF is formed on the light-shielding film CM2 so as to cancel difference in level, and color filters 41 to 43 are formed in succession on the planarization film. The planarization film PF is intended to avoid irregularity that occurs in the spin-coating sequence of the color filters 41 to 43, but the difference in level is not necessarily cancelled as long as the irregularity is allowable. The planarization film PF can be deposited, for example, by spin coating of a resin material, but an inorganic film, such as $SiO_2$, may be deposited and planarization may be performed by CMP. It is considered that, for example, pigment or dye is spin-coated for the color filters 41 to 43 and may be arranged in the Bayer arrangement or the like. However, the arrangement of the color filters 41 to 43 is not limited thereto.

Next, on-chip lenses 51 to 53 are formed on the color filters 41 to 43. Examples of the material of the on-chip lenses 51 to 53 include a styrene-based resin, an acrylic resin, a styrene-acrylic copolymer resin, a siloxane-based resin, and the like that are organic material, but the material of the on-chip lenses 51 to 53 is not limited to these. For lens-shape formation, a photoresist, for example, a photosensitive material with a novolak resin as a main component, is patterned by lithography. The pattern-formed resist is subjected to heat treatment at a temperature higher than the thermal softening point, to form lens shape. With the lens-shaped resist as a mask, the lens shape is pattern-transferred to a primary lens material with a dry etching method, and lenses are formed to all pixels. However, the formation is not limited to this technique. For example, a method of performing deposition of a lens material including a photosensitive resin, prebake, exposure, development, and bleaching exposure processing in succession, and then performing heat treatment at a temperature not less than the thermal softening point of the photosensitive resin, may be used.

The solid-state image pickup element according to the first embodiment described above can be fabricated with the manufacturing method described above.

(C) Third Embodiment

Figure 14:
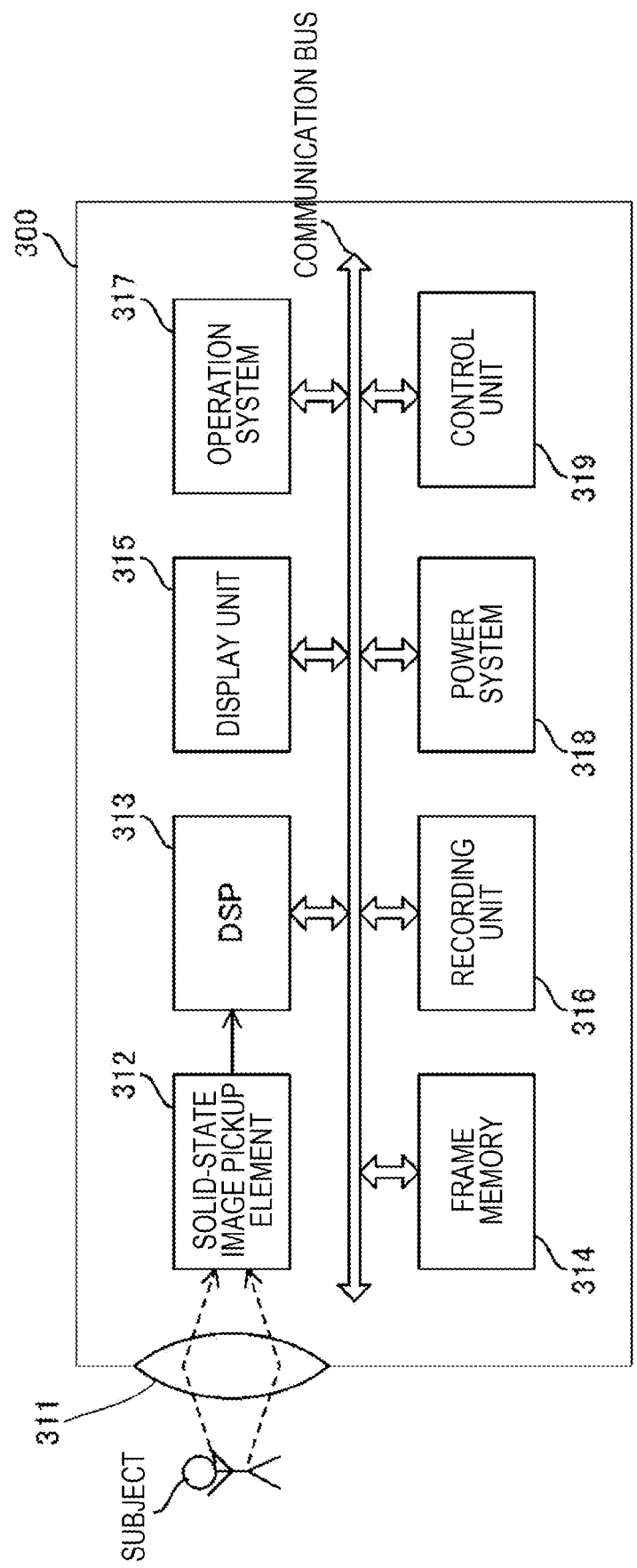
FIG. 14 is a block diagram of the configuration of one embodiment of an electronic apparatus to which the present technology is applied.

FIG. 14 is a block diagram of the configuration of one embodiment of an electronic apparatus to which the present technology is applied.

As illustrated in FIG. 14, an image pickup device 300 as the electronic apparatus includes: an optical unit 311 including, for example, a lens group; a solid-state image pickup element 312; and a digital signal processor (DSP) 313 that is a camera signal processing circuit. Furthermore, the image pickup device 300 includes a frame memory 314, a display unit 315, a recording unit 316, an operation unit 317, a power unit 318, and a control unit 319. The DSP 313, the frame memory 314, the display unit 315, the recording unit 316, the operation unit 317, the power unit 318, and the control unit 319 are mutually connected through a communication bus.

The optical unit 311 receives incident light (image light) from a subject, to form an image on the image pickup face of the solid-state image pickup element 312. The solid-state image pickup element 312 converts the amount of light of the incident light with which the image is formed on the image pickup face by the optical unit 311, into an electric signal in units of pixels, and outputs a color-component signal for forming an image signal indicating the image of the subject, as a pixel signal. Furthermore, the solid-state image pickup element 312 outputs a phase-difference detection signal to be used for phase-difference auto focus (AF), as a pixel signal. As the solid-state image pickup element 312, a solid-state image pickup element, such as the solid-state image pickup element 100 according to the first embodiment described above, can be used.

The display unit 315 including a panel-type display device, such as a liquid crystal panel or an organic electro luminescence (EL) panel, for example, displays a still image or a moving image captured by the solid-state image pickup element 312. The recording unit 316 records the still image or the moving image captured by the solid-state image pickup element 312, into a recording medium, such as a flash memory.

The operation unit 317 issues an operation command for various functions included in the image pickup device 300, in accordance with an operation of a user. The power unit 318 appropriately supplies various power sources to be operation power sources for the DSP 313, the frame memory 314, the display unit 315, the recording unit 316, the operation unit 317, and the control unit 319, to the objects to be supplied with.

The control unit 319 controls the operation of each unit of the image pickup device 300. Furthermore, the control unit 319 performs predetermined computing with the phase-difference detection signal from the solid-state image pickup element 312, to calculate the amount of defocus, and controls the driving of, for example, a shooting lens included in the optical unit 311, for an in-focus state in accordance with the amount of defocus. This arrangement allows performance of the phase-difference AF, resulting in focusing on the subject.

Note that, each embodiment described above has been given exemplarily with the present technology applied to a CMOS image sensor including unit pixels disposed in a matrix, each being to detect signal charge corresponding to the amount of light of visible light, as a physical quantity.

However, the present technology is not limited to application to the CMOS image sensor, and thus can be applied to general solid-state image pickup elements with photoelectric conversion elements PD.

Furthermore, the present technology is not limited to application to a solid-state image pickup element that detects the distribution of the amount of incident light of visible light to capture an image. The present technology can be applied to a solid-state image pickup element that captures the amount of incidence of, for example, infrared rays, X-rays, or particles, as an image, and, as the general meaning, general solid-state image pickup elements, such as a fingerprint detection sensor that detects the distribution of a different physical quantity, such as pressure or electrostatic capacitance, to capture an image (physical-quantity distribution detection devices).

Note that the present technology is not limited to each embodiment described above, and includes, for example, a configuration in which each configuration disclosed in each embodiment described above is mutually replaced with another configuration or an alternation is made in combination and a configuration in which a publicly known technology and each configuration disclosed in each embodiment described above are mutually replaced or an alternation is made in combination. Furthermore, the technical scope of the present technology is not limited to the embodiments described above, but covers the matters described in the scope of the claims and equivalents thereof.

Then, the present technology can have the following configurations.

(1)

A solid-state image pickup element including:

a plurality of pixels each including a photoelectric conversion element formed on a silicon substrate, in which some pixels in the plurality of pixels each have the photoelectric conversion element partitioned by a first-type separating region extending in a plate shape in a direction along a thickness direction of the silicon substrate, and other pixels in the plurality of pixels each have the photoelectric conversion element partitioned by a second-type separating region formed with a material different from a material of the first-type separating region, the second-type separating region extending in a plate shape in the direction along the thickness direction of the silicon substrate.

(2)

The solid-state image pickup element described in (1) above, in which the pixels each having the photoelectric conversion element partitioned by the first-type separating region are different in color from the pixels each having the photoelectric conversion element partitioned by the second-type separating region.

(3)

The solid-state image pickup element described in (1) or (2) above, in which the plurality of pixels includes a combination of a red pixel, a blue pixel, and a green pixel, the pixels each having the photoelectric conversion element partitioned by the second-type separating region, include the blue pixel, and the pixels each having the photoelectric conversion element partitioned by the first-type separating region, include the red pixel and the green pixel.

(4)

The solid-state image pickup element described in (1) or (2) above, in which the second-type separating region having the plate shape includes a silicon dioxide film, the second-type separating region having a plate thickness equal to or less than a wavelength of blue light.

(5)

A method of manufacturing a solid-state image pickup element that includes a plurality of pixels each including a photoelectric conversion element formed on a silicon substrate, the method including:

a step of forming a first-type separating region extending in a plate shape in a direction along a thickness direction of the silicon substrate, the first-type separating region partitioning the photoelectric conversion element of each of some pixels in the plurality of pixels; and a step of forming a second-type separating region with a material different from a material of the first-type separating region, the second-type separating region extending in a plate shape in the direction along the thickness direction of the silicon substrate, the second-type separating region partitioning the photoelectric conversion element of each of other pixels in the plurality of pixels.

(6)

An electronic apparatus including:

a solid-state image pickup element that includes a plurality of pixels each including a photoelectric conversion element formed on a silicon substrate, in which some pixels in the plurality of pixels each have the photoelectric conversion element partitioned by a first-type separating region extending in a plate shape in a direction along a thickness direction of the silicon substrate, and other pixels in the plurality of pixels each have the photoelectric conversion element partitioned by a second-type separating region formed with a material different from a material of the first-type separating region, the second-type separating region extending in a plate shape in the direction along the thickness direction of the silicon substrate.

REFERENCE SIGNS LIST

10 Semiconductor substrate
10F Surface
10R Back face
12 Element separator
20 Wiring layer
30 Insulating layer
31 Light-shielding film
40 Color filter layer
41 to 43 Color filter layers
50 On-chip lens layer
51 to 53 On-chip lenses
100 Solid-state image pickup element
300 Image pickup device
311 Optical unit
312 Solid-state image pickup element
313 Digital signal processor (DSP)
314 Frame memory
315 Display unit
316 Recording unit
317 Operation unit
318 Power unit
319 Control unit
CM1 Light-shielding-film material layer
CM2 Light-shielding film
Dp1 Impurity ion region
F1 Oxide film
F2 Oxide film
HM Silicon dioxide film
HM1 Opening PD Photoelectric conversion element
PF Planarization film
PD1 First portion
PD2 Second portion
PX1 Pixel
PX2 Pixel
R Resist mask
R1 Opening
SB Support substrate
SP1 First-type separating region
SP2 Second-type separating region
T Trench

What is claimed is:

1. A light detecting device, comprising:
    first, second, third, and fourth pixels disposed adjacent to each other in a plan view, and
    the first, second, third, and fourth pixels including first, second, third, and fourth photoelectric conversion regions,
    wherein the first photoelectric conversion region is divided completely into two portions in the plan view, first and second portions, by a first separation region,
    wherein the second photoelectric conversion region is divided completely into two portions in the plan view, third and fourth portions, by a second separation region,
    wherein the third photoelectric conversion region is divided completely into two portions in the plan view, fifth and sixth portions, by a third separation region,
    wherein the fourth photoelectric conversion region is divided completely into four portions in the plan view, seventh, eighth, ninth, and tenth portions, by a fourth separation region,
    wherein the fourth separation region is a cross shape in the plan view,
    wherein the first, second, third, and fourth pixels are disposed in a 2×2 array, and
    wherein each of the first, second, third and fourth separation regions extends from a first surface of each of corresponding first through tenth portions of the first through fourth photoelectric conversion regions to a second surface of each of the corresponding first through tenth portions of the first through fourth photoelectric conversion regions without extending beyond the first surface and the second surface of the corresponding first through tenth portions of the first through fourth photoelectric conversion regions in a cross-sectional view.

2. The light detecting device according to claim 1, wherein at least the first separation region is of a first type, and wherein at least one of the second, third, and fourth separation regions is of a second type.

3. The light detecting device according to claim 2, wherein the first type includes an impurity ion implanted region.

4. The light detecting device according to claim 3, wherein the second type includes a silicon dioxide film.

5. The light detecting device according to claim 1, wherein the first pixel is a red pixel.

6. The light detecting device according to claim 5, wherein a color filter passes red light to the first pixel.

7. The light detecting device according to claim 5, wherein the second pixel is green pixel, wherein the third pixel is a green pixel, and wherein the fourth pixel is a blue pixel.

8. The light detecting device according to claim 1, further comprising an element separator, wherein the first, second, third, and fourth pixels are separated from other pixels in the light detecting device by the element separator.

9. The light detecting device according to claim 8, wherein the element separator includes a silicon dioxide film embedded in a trench.

10. The light detecting device according to claim 1, wherein at least the first separation region is of a first type and wherein the second and third separation regions are of a second type.

11. A light detecting device, comprising:
    a plurality of pixels, each of the pixels including a photoelectric conversion element formed in a semiconductor substrate, the plurality of pixels including:
    a first pixel, wherein a first photoelectric conversion element of the first pixel is divided completely into two portions in a plan view by a first separation region;
    a second pixel, wherein a second photoelectric conversion element of the second pixel is divided completely into two portions in the plan view by a second separation region;
    a third pixel, wherein a third photoelectric conversion element of the third pixel is divided completely into two portions in the plan view by a third separation region; and
    a fourth pixel, wherein a fourth photoelectric conversion element of the fourth pixel is divided completely into four portions in the plan view by a fourth separation region, wherein the fourth separation region is a cross shape in a plan view,
    wherein the first, second, third, and fourth pixels are disposed in a 2×2 array, and
    wherein each of the first, second, third and fourth separation regions extends from a first surface of each of corresponding first through fourth photoelectric conversion elements to a second surface of each of the corresponding first through fourth photoelectric conversion elements without extending beyond the first surface and the second surface of the corresponding first through fourth photoelectric conversion elements in a cross-sectional view.

12. The light detecting device according to claim 11, wherein at least the first separation region is of a first type, and wherein at least one of the second, third, and fourth separation regions is of a second type.

13. The light detecting device according to claim 12, wherein the first type includes an impurity ion implanted region.

14. The light detecting device according to claim 13, wherein the second type includes a silicon dioxide film.

15. The light detecting device according to claim 11, wherein the first pixel is a red pixel.

16. The light detecting device according to claim 15, wherein a color filter passes red light to the first pixel.

17. The light detecting device according to claim 15, wherein the second pixel is green pixel, wherein the third pixel is a green pixel, and wherein the fourth pixel is a blue pixel.

18. The light detecting device according to claim 11, further comprising an element separator, wherein the first, second, third, and fourth pixels are separated from other pixels in the light detecting device by the element separator.

19. The light detecting device according to claim 18, wherein the element separator includes a silicon dioxide film embedded in a trench.

20. The light detecting device according to claim 11, wherein at least the first separation region is of a first type and wherein the second and third separation regions are of a second type.

* * * * *